United States Patent [19]

Brown et al.

[11] Patent Number: 5,304,805
[45] Date of Patent: Apr. 19, 1994

[54] OPTICAL-HETERODYNE RECEIVER FOR ENVIRONMENTAL MONITORING

[75] Inventors: Elliott R. Brown, Billerica; K. Alexander McIntosh, Groton, both of Mass.

[73] Assignee: Massachusetts Institute of Technology, Cambridge, Mass.

[21] Appl. No.: 37,239

[22] Filed: Mar. 26, 1993

[51] Int. Cl.$^5$ .............................................. G01J 5/02
[52] U.S. Cl. .............................. 250/338.1; 250/338.5; 250/339.01
[58] Field of Search .................. 250/338.5, 338.1, 339, 250/370.12

[56] References Cited

U.S. PATENT DOCUMENTS

| | | | |
|---|---|---|---|
| 3,856,406 | 12/1974 | Noble et al. | 250/338.5 |
| 4,894,526 | 1/1990 | Bethea et al. | 250/370.12 |
| 5,229,614 | 7/1993 | Andersson et al. | 250/370.12 |

OTHER PUBLICATIONS

"Atmospheric Monitoring Using Heterodyne Detection Techniques", Robert T. Menzies, *Optical Engineering*, vol. 17, No. 1, Jan./Feb. 1978, pp. 44–49.
"Infrared Heterodyne Spectroscopy", Mumma et al., *Optical Engineering*, Mar./Apr. 1982, vol. 21, No. 2, pp. 313–319.
"Remote Infrared Heterodyne Radiometer Measurements of Atmospheric Ammonia Profiles", Hoell et al, *Geophysical Research Letters*, vol. 7, No. 5, May 1980, pp. 313–316.
"Detection of Optical and Infrared Radiation", R. H. Kingston, *Springer Series in Optical Sciences*, 1978, pp. 52–65.
"High Sensitivity Low Dark Current 10 $\mu$m GaAs Quantum Well Infrared Photodetectors", Levine et al., *Appl. Phys. Lett.* 56(9), Feb. 26, 1990, pp. 851–853.
"Performance Limitations of GaAs/AlGaAs Infrared Superlattices", M. A. Kinch, *Appl. Phys. Lett.* 55(20), Nov. 13, 1989, pp. 2093–2095.

*Primary Examiner*—Carolyn E. Fields
*Attorney, Agent, or Firm*—Hamilton, Brook, Smith & Reynolds

[57] ABSTRACT

A GaAs/AlGaAs multiple-quantum-well (MQW) is used as an optical mixer for environmental monitoring of atmospheric emission or absorption signals in the infrared (IR) region. The atmospheric signals are combined with coherent laser local oscillator emission lines to produce IF signals within the electrical bandwidth of the MQW mixer.

19 Claims, 5 Drawing Sheets

OPTICAL-HETERODYNE RECEIVER FOR ENVIRONMENTAL MONITORING

GOVERNMENT SUPPORT

The Government has rights in this invention pursuant to Contract/Grant No. 317-8-201 from DARPA.

BACKGROUND OF THE INVENTION

Tunable infrared (IR) lasers and heterodyne receivers have been used in the 3 to 5 and 8 to 12 μm atmospheric windows to monitor ozone and other trace constituents. Standard direct detection techniques have limitations due to detector noise or background thermal noise, which make measurements with high spectral resolution difficult. (See "Atmospheric Monitoring Using Heterodyne Detection Techniques", R. T. Menzies, *Optical Engineering*, V17N1, Jan/Feb 1978, p. 44.)

Conventional IR heterodyne spectroscopy combines radiation from a coherent local oscillator (LO), such as a $CO_2$ laser, with source radiation on a nonlinear detector to produce an electrical intermediate-frequency (IF) output signal lying in the microwave spectrum.

The best detector for this application has heretofore been the mercury cadmium telluride (HgCdTe) detector. (See "Infrared Heterodyne Spectroscopy", Mumma et al., *Optical Engineering*, V21N2, Mar/Apr 1982, p. 13.

The maximum electrical bandwidth $B_{IF}$ of the best HgCdTe detectors is about 3 GHz, which prevents spectral monitoring at frequencies more than $B_{IF}$ away from the LO frequency. Thus when the LO is a $CO_2$ laser, most of the infrared radiation between 9 and 11 microns can not be detected because the adjacent $CO_2$ emission lines are separated by much more than 3 GHz. Typically the $CO_2$ line separation is at least 30 GHz (1 $cm^{-1}$).

SUMMARY OF THE INVENTION

In general, the present invention involves an improved heterodyne receiver for environmental monitoring in which a wide electrical bandwidth quantum well device is utilized as the optical mixer of a heterodyne or coherent-detection receiver. The bandwidth of the mixer is at least equal to the separation between the emission lines of a coherent laser LO. In this way the entire spectral band between, for example, 9 and 11 μm or between 3 and 5 μm can be detected as the LO is tuned over its emission lines. In one embodiment, the local oscillator is a $CO_2$ gas laser and the optical mixer is a multiple quantum well (MQW) mesa. In another embodiment; the mixer is integrated with a wide electrical band heterostructure field effect transistor amplifier (HFET) to take advantage of the wide electrical bandwidth of each and to obtain very low parasitic reactance.

DETAILED DESCRIPTION OF THE INVENTION

Figure 1:
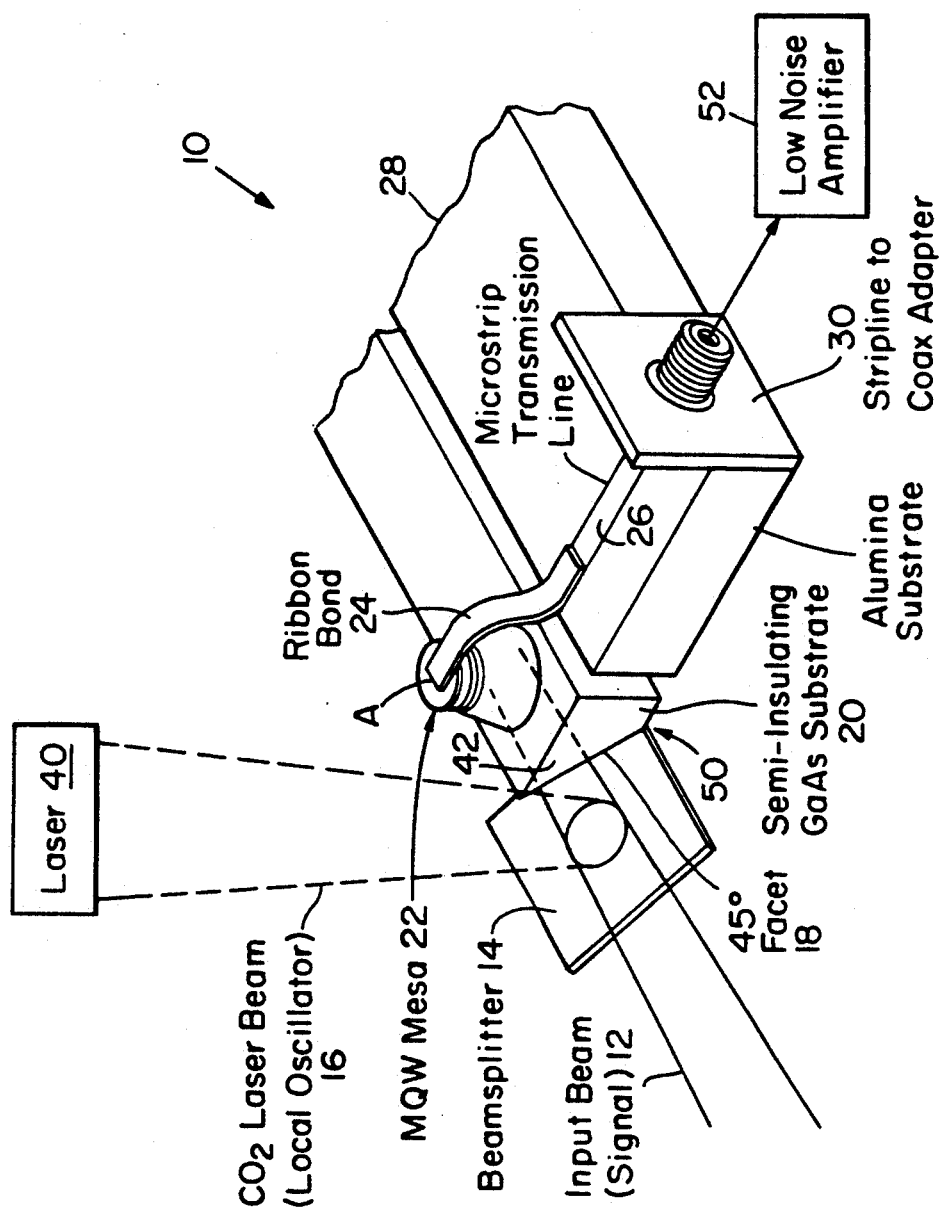
FIG. 1 is a partial schematicized perspective view of an experimental version of an embodiment of the invention.

Referring now to FIG. 1, a first embodiment of the invention will now be described, in detail, in connection therewith. FIG. 1 depicts a coherent receiver 10 for detecting atmospheric molecular emissions and absorption lines in the infrared region (9-11 microns range) of an input beam 12. In accordance with the invention, the emission or signal beam is combined with a coherent local oscillator beam 16 supplied by a laser 40. Preferably, laser 40 is a $CO_2$ laser, capable of emitting light of sufficient power at several discrete frequencies. The two beams are optically combined on a beamsplitter 14 which consists of a transparent dielectric with a low-reflection optical coating.

The combined beam 42 is directed upon a 45° input facet 18 of a MQW mixer 50 by a lens (not shown). The input facet 18 is formed on a semi-insulating GaAs substrate 20, upon which an MQW mesa 22 has been formed. The substrate is soldered onto the cold finger of a helium closed cycle refrigerator (not shown).

The process of absorption of the combined beams by the MQW mixer yields electrical currents in the detector that vary in time at the difference or intermediate frequency (IF) between the combined beams. A ribbon bond 24 couples the IF currents from the MQW mixer to a microstrip transmission line 26 formed on an alumina substrate 28. A stripline to coaxial adapter 30 is used to further couple the mixed signal to a series combination of a bias tee, an isolator (not shown), and a chain of low noise broadband amplifiers 52. The isolator is important for calibration purposes because it eliminates any dependence of the gain and noise figure of the amplifiers on the source impedance. Several different isolators may be used, covering the 0.1 to 12 GHz band. Two different amplifier chains may be used, providing gain from 0.1 to 2 GHz and 2 to 18 GHz, respectively.

The MQW mixer can be operated in either the bound-to-extended or bound-to-bound modes. In both modes, the photon input beam excites a carrier from the lowest quantum-well sub-band to a higher energy sub-band. The carrier then drifts in the applied electric field toward the collecting contact. Because the MQW mixer is a photoconductor, either of the two electrical contacts can be the collecting contact. Which contact collects depends on the direction of the applied electric field. The IR response spectrum of the MQW mixer has a well-defined peak wavelength which is determined mostly by the width of the quantum well and the conduction band offset between the quantum-well and barrier materials. A large number ($\approx 100$) of quantum wells are required to obtain a high fractional absorption of the incident radiation or, equivalently, a high absorptive quantum efficiency.

Preferably, the MQW mixer 50 is fabricated using n-type GaAs quantum wells and undoped $Al_xGa_{1-x}As$ ($X \approx 0.2$) barriers. The preferred operating mode is the bound-to-extended, which yields high responsivity ($\approx 0.5$ A/W) and photoconductive gain ($\approx 1$). However, other III-V semiconductor materials and operating modes are possible.

The one clear advantage that the MQW devices have over HgCdTe devices is speed. From measurements of the photoconductive gain, the photoconductive lifetime of the GaAs/AlGaAs MQW device has been found to be approximately 2 ps. This corresponds to a 3-dB bandwidth of about 60 GHz, compared to a bandwidth of about 3 GHz for the fastest HgCdTe photodiodes. The superior bandwidth is of little consequence in direct detection, i.e., non-coherent or non-heterodyne detection, but can be used to great advantage in coherent detection, as discussed below.

In the optical-heterodyne or coherent detection mode, the output beam from a laser is mixed with radiation from an incoherent source to generate power at intermediate frequencies (IFs) lying in the microwave region, as shown in FIG. 1. The main limiting performance characteristic of the MQW structure as a direct detector—the high dark current—is overcome in this approach by applying enough LO power to generate a higher photocurrent. This allows one to approach the photon shot-noise limited performance for a photoconductor, given by a noise equivalent power (NEP) of $2h\gamma_{LO}B_{IF}/\eta_0$, where h is Planck's constant, $\gamma_{LO}$ is the local oscillator frequency, $\eta_0$ is the external dc quantum efficiency of the mixer, and $B_{IF}$ is the IF electrical bandwidth. Another characteristic of the MQW mixer, its relatively narrow IR response bandwidth, remains unchanged in the heterodyne mode.

In an experimental prototype, the MQW mixer 50 of FIG. 1 contains fifty 4.5-nm-wide GaAs quantum wells separated by 20-nm-thick $Al_{0.23}Ga_{0.77}As$ barriers. The center 2.5-nm region of each well was doped n-type with Si to a density of $N_D \approx 2.5 \times 10^{18}$ cm$^{-3}$, yielding an electron sheet density of approximately $6 \times 10^{11}$ cm$^{-2}$. The well width and barrier composition were chosen to obtain a peak absorption in the $CO_2$-laser band between approximately 900 and 1100 cm$^{-1}$. After growth, the infrared transmission through the wafer was tested by Fourier-transform infrared spectroscopy. The absorption peak occurred at 920 cm$^{-1}$ at room temperature and had a full width at half-maximum of approximately 240 cm$^{-1}$. At 77 K the peak shifted to approximately 1000 cm$^{-1}$. This absorption is characteristic of a bound-to-extended state transition, as observed by others in GaAs/AlGaAs MQW structures. The wafer was grown by molecular beam epitaxy (MBE) at a substrate temperature of 705° C. Mixing mesas having diameters of 150 and 75 μm were defined by wet etching. Chips a few millimeters on a side were cleaved from the substrate 20, and 45° facets 18 were lapped on the edges of the chips for efficient coupling of IR radiation to the MQW mesa 22. The input beam was supplied by a 1000-K blackbody.

Using the experimental setup of FIG. 1, we made measurements on a 150-μm MQW mixer using the $CO_2$ laser 40, alone, to determine the following parameters important in coherent detection: external responsivity, photoconductive gain, electrical bandwidth, and quantum efficiency. The responsivity was obtained from the current-voltage (I-V) curves measured under varying levels of $CO_2$ laser illumination at a local oscillator wavelength $\lambda_{LO} = 10.2$ μm. The responsivity was calculated as the ratio of the change in current to the incident power $P_{LO}$. Up to 3.0 V bias voltage ($V_B$), the responsivity was practically independent of $P_{LO}$ at a fixed bias voltage. However, with varying $V_B$ and fixed $P_{LO}$, it increased nearly linearly up to 2.4 V and decreased at higher voltages.

Figure 3:
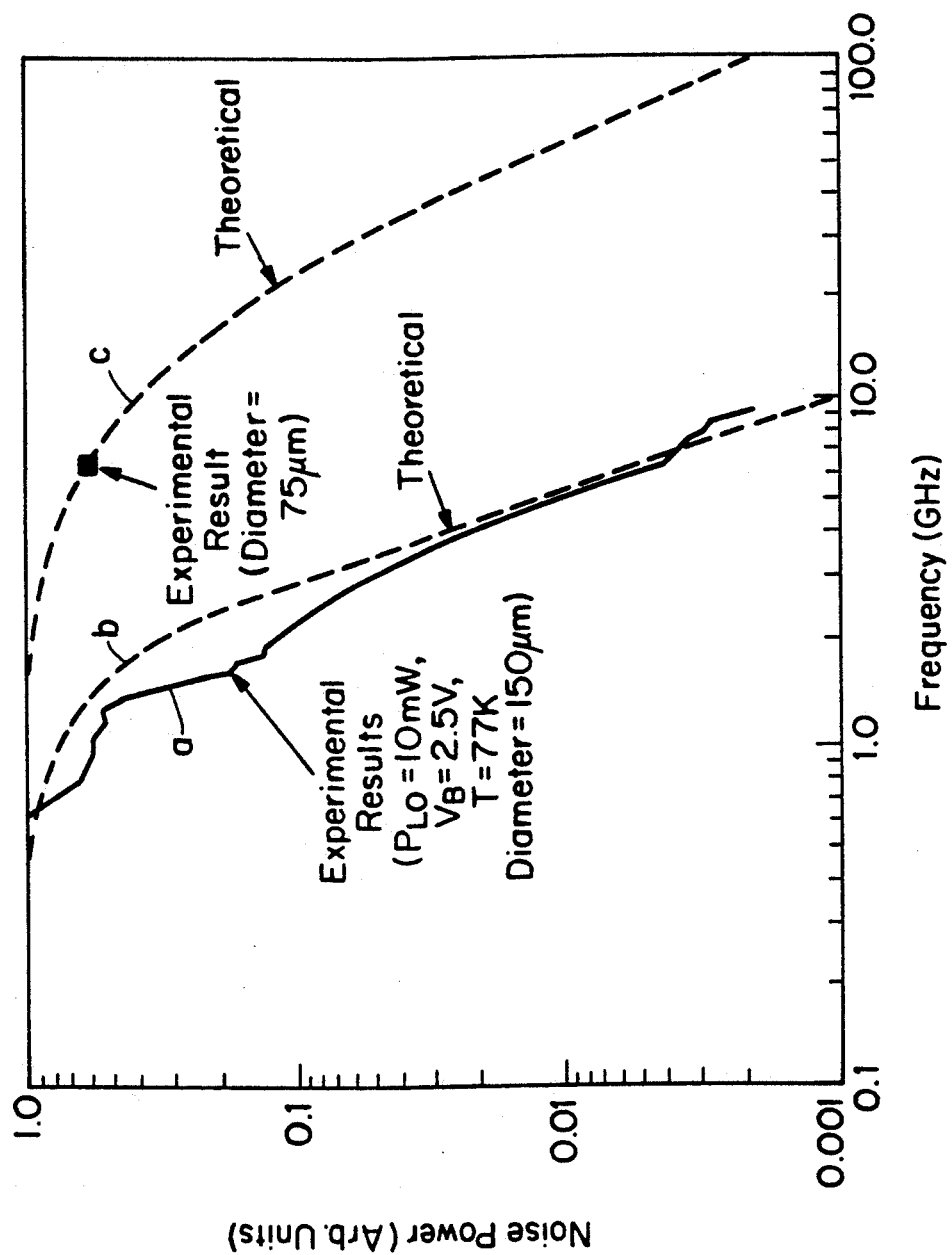
FIG. 3(a) is a plot of the normalized experimental generation-recombination (G-R) noise spectra for 150 and 75 μm wide MQW mixer.

The gain and bandwidth were determined from the power spectrum of laser-induced photocurrent fluctuations, or photon-induced generation-recombination (G-R) noise. The power spectrum was obtained by chopping the $CO_2$ laser beam and measuring the output power density from the amplifier chains using a spectrum analyzer and lock-in amplifier. To divide out the amplifier gain, a second spectrum was measured by replacing the MQW mixer with a calibrated coaxial noise diode. The normalized G-R noise spectra for 150 and 75 μm diameter detectors are shown in FIG. 3. The photocurrent power spectra are described by G-R noise theory. In the frequency independent part of the spectrum below the high-frequency rolloff, the spectral density of G-R noise at the output of the device is given by $$S_I = 4egI_0 \left[ \frac{R_D}{R_D + R_A} \right]^2 R_A \quad (1)$$

where g is the photoconductive gain, $I_0$ is the dc current, $R_D$ is the differential resistance of the MQW device at the dc bias point, and $R_A = 50$ Ω is the amplifier input resistance. Using this expression with the experimental spectral density, we obtained a maximum gain of 0.27 at a bias voltage of 2.8 V. This means that an electron excited by the laser into the extended band of states will, on the average, drift 13.5 periods of the MQW structure before relaxing into a quantum well. From the same photocurrent-noise spectrum, the bandwidth was determined as the frequency of 3-dB rolloff in power. For example, at $V_B = 2.4$ V, T = 77 K, and $P_{LO} = 10$ mW, we observed a 3-dB bandwidth of 1.5 GHz. The bandwidth increased slightly with $V_B$ between 1 and 3 V, but was practically independent of $P_{LO}$.

Figure 4:
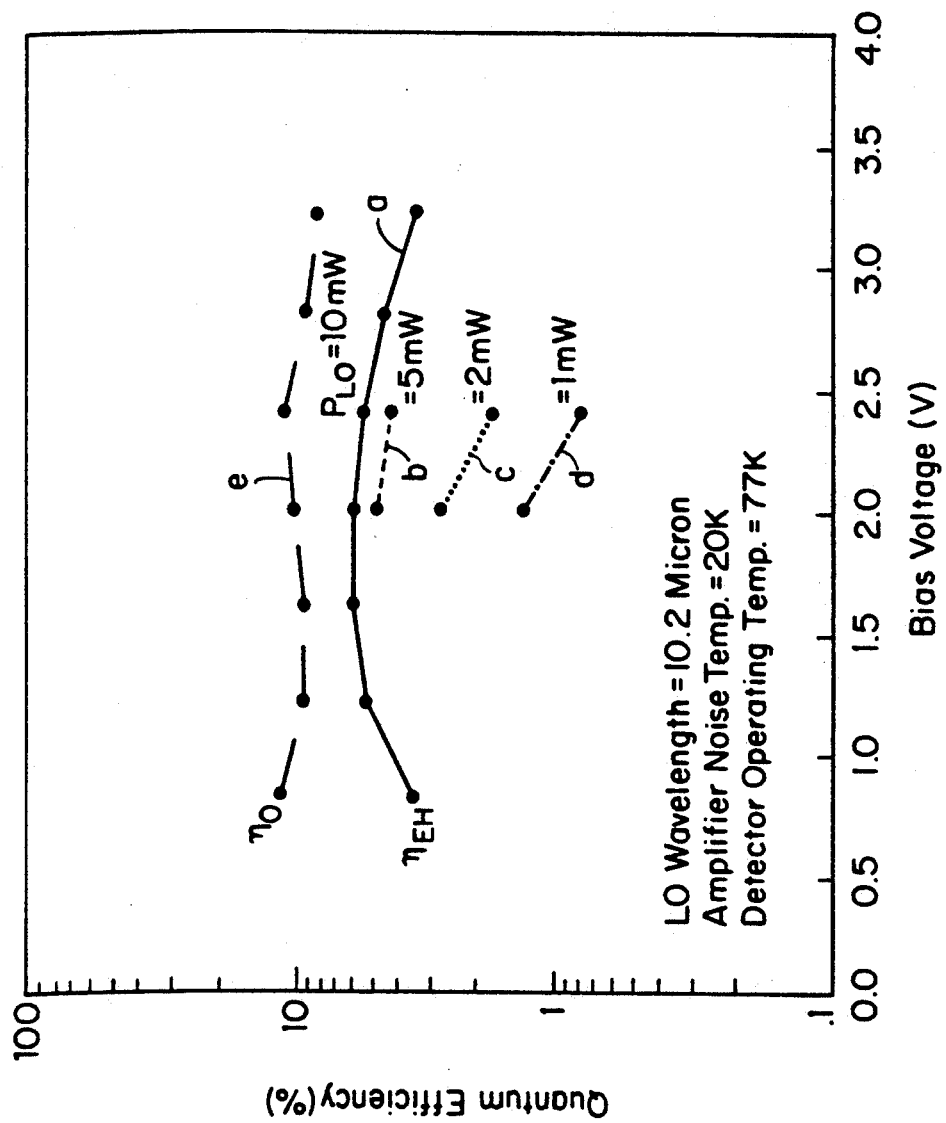
FIG. 4 is a plot of external and effective-heterodyne quantum efficiencies of a 150-μm-diameter MQW mixer at 77 K.

Knowing the responsivity r and the gain, we calculated the external quantum efficiency $\eta_0$ using the fundamental law of photoconductivity, $r = \eta_0 eg/h\nu$. For example, at $V_B = 2.4$ V, $\lambda_{LO} = 10.2$ μm, and $P_{LO} = 10$ mW, we measured r = 0.22 mA/mW and g = 0.24, leading to $\eta_0 = 11\%$. The resulting curve of $\eta_0$ in FIG. 4 is practically independent of $V_B$, as expected. Electrons that escape the quantum wells are rapidly replaced by electrons from the cathode, so the sheet density in the wells remains at an equilibrium level.

The process of mixing the laser beam with blackbody radiation generates currents at intermediate frequencies (IFs) between the two sources. The blackbody acts as a broadband optical noise source having a spectral density per spatial mode of $$S_P = \frac{h\nu\epsilon}{e^{h\nu/kT_{BB}} - 1}, \quad (2)$$

where $\nu$ is the optical frequency, $\epsilon$ is the emissivity, and $T_{BB}$ is the blackbody temperature. The $CO_2$ laser produces a single frequency $\nu_{LO}$ in a unimodal output beam. Since mixing products are only produced for incident blackbody power in a spatial mode identical to that of the laser, the power available for down-conversion is given by Eq. (2) times the transmission coefficient T between the blackbody and the MQW detector. This provides a means of calibrating the heterodyne sensitivity, which is quantified by the noise-equivalent power NEP$_{HET}$ or the effective heterodyne quantum efficiency $\eta_{EH}$. In the present experiment, NEP$_{HET}$ is the blackbody power in the laser mode that would be required to obtain an IF signal-to-noise (S/N) ratio of unity at the input to the preamplifier. The IF signal is the down-converted blackbody power and the IF noise is the sum of the dark-current and laser-induced photocurrent noise powers. Thus, we can write $$NEP_{HET} = 2\Delta f \left[ \frac{h\nu\epsilon T}{e^{h\nu_{LO}/kT_{BB}} - 1} \frac{N}{S} \right], \quad (3)$$

where $\Delta f$ is the IF passband. The leading factor of two accounts for the fact that power at any given IF arises from two optical sideband frequencies, $\nu_{LO}+$IF and $\nu_{LO}-$IF. Since the bandwidth of the present mixer is much less than $\nu_{LO}$, the spectral density of Eq. (2) and the optical transmission are independent of the frequency over the range of both sidebands. In principle, the minimum theoretical NEP$_{HET}$ for a photoconductor is NEP$_{HET} = 2h\nu_{LO}\Delta f/\eta_0$, which is twice the photon-noise limit of photodiodes. To indicate the magnitude of the experimental NEP$_{HET}$ relative to the limit, the effective heterodyne quantum efficiency $\eta_{EH}$ for a photoconductor is defined by NEP$_{HET} = 2h\nu\Delta f/\eta_{EH}$.

Next a heterodyne experiment was carried out by mixing the CO$_2$-laser beam 16 and the blackbody radiation 12 on a 150-$\mu$m-diameter mesa MQW detector 50 at T=77 K and $\lambda_{LO}$=10.2 $\mu$m. An IF passband was defined by a 50-MHz wide filter centered at 1.5 GHz and connected after the amplifier 52. The IF signal to noise (S/N) ratio was measured by separately chopping the blackbody beam 12, the laser beam 16, and the mixer bias supply (not shown), and synchronously detecting the filter output power using a coaxial square-law detector and lock-in amplifier. The measurements were carried out as a function of $V_B$ up to 3.2 V and LO power up to 10 mW. Plotted in curves a-d of FIG. 4 is the experimental $\eta_{EH}$ for these experimental conditions. With increasing $P_{LO}$, $\eta_{EH}$ asymptotically approaches $\eta_0$. The highest $\eta_{EH}$ was 6.4% at $\lambda_{LO}$=10.2 $\mu$m, $V_B$=2.0 V and $P_{LO}$=10 mW. The corresponding value of NEP$_{HET}/\Delta f$ is 5.5$\times 10^{-19}$ W Hz$^{-1}$, compared to a photocurrent-noise limited value (curve e) of 3.5$\times 10^{-19}$ W Hz$^{-1}$ for this device. This NEP$_{HET}/\Delta f$ is approximately 10 times greater than that of the best HgCdTe photodiodes at $\lambda_{LO}$=10.6 $\mu$m, T=77 K, and an IF of 1.5 GHz. The difference is attributed primarily to the lower $\eta_0$ of the present MQW device.

As in all photoconductors, the electrical bandwidth of the MQW device may be limited either by the photocarrier lifetime or by the decrease of the load resistance with frequency caused by parasitic reactance. The lifetime $\tau$ is related to the photoconductive gain through $g=\tau/t_T$, where $t_T$ is the transit time of a photoexcited electron across the MQW structure of length L. Assuming that the electron drifts across the structure at a velocity of $V_S$=1$\times 10^7$ cm s$^{-1}$, we obtain $t_T \approx L/V_S$=12 ps. At $V_B$=2.0 V, g=0.21 and thus $\tau$=2.5 ps. Acting alone, this would yield a bandwidth of $(2\pi\tau)^{-1} \approx$64 GHz, which is much greater than the measured bandwidth. The most important parasitic elements in our circuit are the detector capacitance, $C_D \approx$1.4 pF, and the bond-ribbon capacitance. In conjunction with the 50-$\Omega$ amplifier input resistance, the detector capacitance alone yields a 3-dB bandwidth of $(2\pi R_A C)^{-1}$=2.3 GHz.

The foregoing argument implies that an MQW device of lower capacitance would have proportionately higher bandwidth. To explore this possibility, we packaged a 75-$\mu$m-diameter device from the same MQW wafer and measured the photocurrent-noise spectrum. A thin wire bond was used in lieu of the ribbon to further reduce the capacitance. We obtained a 3-dB electrical bandwidth of approximately 8 GHz, consistent with a five-times reduction in the capacitance. This is roughly three times the bandwidth of the fastest HgCdTe photodiodes. Another benefit of the 75-$\mu$m device is that is provides a higher $\eta_{EH}$ than the 150-$\mu$m device at a given LO power. We measured $\eta_{EH}$=9.5% at $P_{LO}$=2.5 mW, $V_B$=2.0 V, and an IF of 1.5 GHz. The improved performance stems from the fact that a decrease in the area of the MQW device has little affect on the responsivity but reduces the dark current proportionately.

The photon-noise-limited NEP$_{HET}$ of the GaAs/AlGaAs MQW mixer could be improved significantly by increasing $\eta_0$. Some simple ways to increase $\eta_0$ are to increase the number of quantum wells and the electron sheet density relative to the present sample, and to fabricate an antireflection coating on the 45° facet. For example, $\eta_0$ would increase to approximately 47% (i.e., 2h$\nu_{LO}/\eta_0$ would decrease to 8$\times 10^{-20}$ W Hz$^{-1}$) by increasing the number of wells and sheet density to 100 and 1$\times 10^{-12}$ cm$^{-2}$, respectively, and by reducing the 45°-facet reflectivity to 1%. These changes would lower g roughly two-fold, but would also reduce the capacitance. A further decrease in the capacitance with little change in g or $\eta_0$ would occur by increasing the barrier thickness to 40 nm as in some of the best GaAs/AlGaAs direct mixer. Through these means of optimization, a mixer having an NEP$_{HET}/\Delta f<10^{-19}$ W Hz$^{-1}$ and a bandwidth well over 20 GHz should be realized. This performance corresponds to a sensitivity-bandwidth product that far exceeds that allowed by the best HgCdTe photodiodes. Such a device would be very useful in coherent receivers for wideband CO$_2$-laser based spectroscopy, communications, and radar.

The intrinsic photoconductive electrical bandwidth could be increased by reducing $\tau$. The calculated value of 2.5 ps in the MQW prototype could be reduced by changing the material parameters in the structure. In this way, photoconductive bandwidths exceeding 100 GHz could be achieved.

Figure 2:
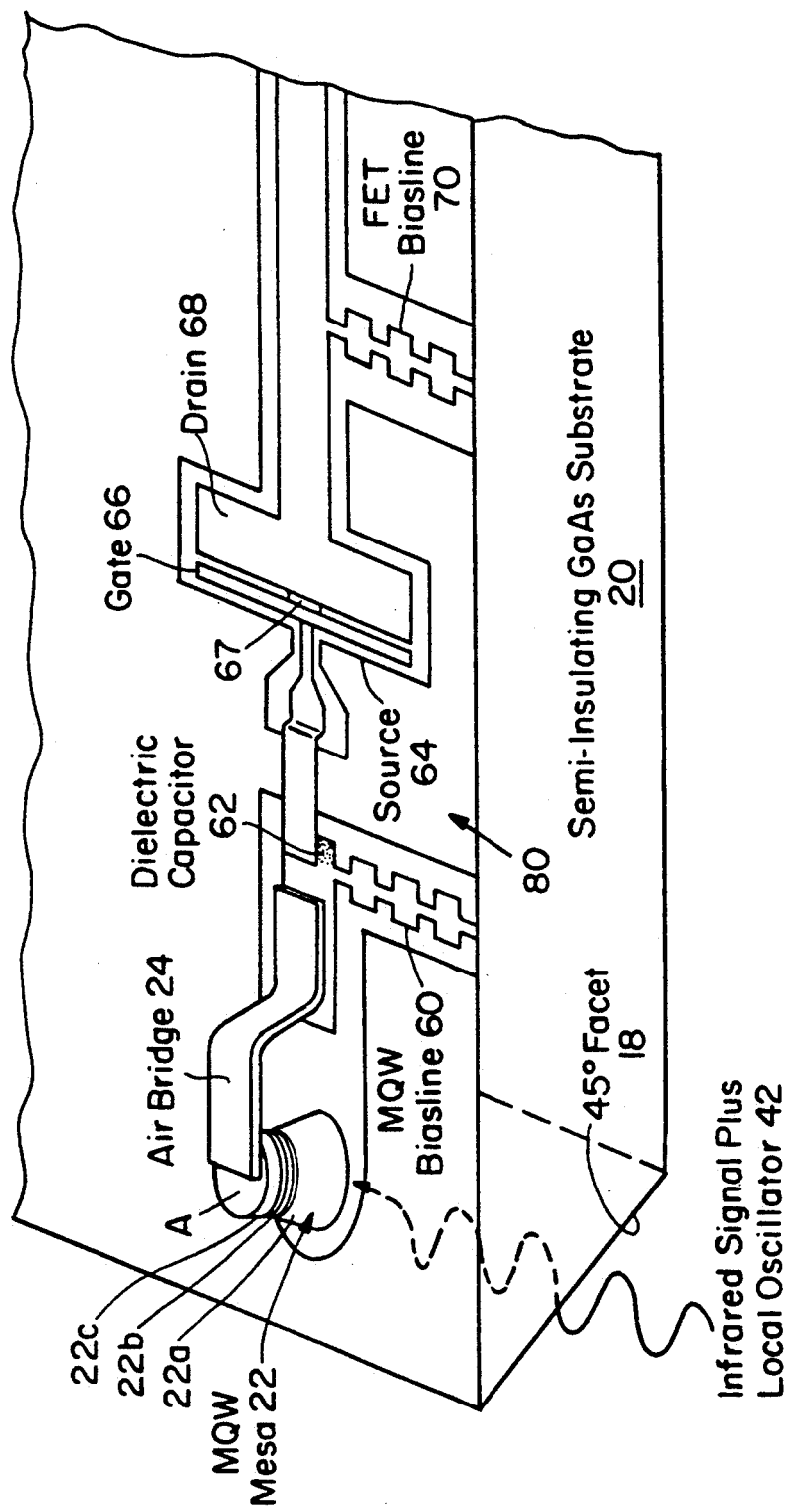
FIG. 2 is a partial schematicized perspective view of an alternate embodiment of the invention.

Referring now to FIG. 2, an alternate embodiment of the invention will be described in connection therewith. Note that items in FIG. 2, corresponding to similar items in FIG. 1, carry the same reference numeral. FIG. 2 illustrates a monolithically integrated GaAs/AlGaAs MQW mesa 22 and low noise GaAs/AlGaAs heterostructure field effect transistor (HFET) preamplifier, shown generally at 80.

HFET transistors have a very low noise figure at room temperature and a substantially lower noise figure at cryogenic temperature. The bandwidth of these amplifiers easily exceeds 15 GHz. For example, a 1.0-$\mu$m-gate GaAs/Al$_{0.3}$Ga$_{0.7}$As HFET operating at 77 K will provide a unity-current-gain cutoff frequency of approximately 25 GHz and a noise temperature of about 20 K. Besides providing low noise figure, the monolithic structure will present less parasitic reactance, so that there will be less chance of spurious oscillations over the wide bandwidth.

As shown in FIG. 2, the integrated MQW mixer and HFET amplifier may be formed on a semi-insulating GaAs substrate, as follows:

Starting at the top surface, the first epitaxial layers deposited on the substrate will be the GaAs and AlGaAs layers required for the HFET. The top AlGaAs layer will act both as the barrier layer between the gate 66 and channel 67 of the HFET, and as an etch stop layer for isolating the MQW layers in the fabrication. Above these layers, an n-type GaAs buffer layer 22a will be deposited followed by the MQW structure 22b. Above the MQW structure, a heavily doped n-type GaAs layer 22c is deposited for ohmic contact to the MQW structure. All of these layers are deposited by molecular beam epitaxy (MBE) at a temperature of approximately 600°-700° C.

After epitaxial growth, the first fabrication step is to define the top ohmic contact of the MQW mesa by metal deposition and photoresist lift off. Using the metal as a mask, wet chemical etching is then employed to remove the MQW epitaxial layers down to the GaAs buffer layer. At this point, a reactive ion etch is used to etch down to the top AlGaAs barrier of the HFET. Once the etch stops at the AlGaAs layer, the remaining steps entail standard fabrication of drain and source ohmic contacts 68 and 64 respectively on the HFET, and forming an air-bridge contact 24 from the top ohmic metal of the MQW mesa to the source via dielectric capacitor 62 coupled to voltage bias line 60. A second bias line 70 is formed at the junction between stripline 72 and drain 68 of HFET 80.

The MQW structure may be grown by standard MBE on semi-insulating GaAs substrates. This emphasizes two other important advantages of the GaAs/AlGaAs MQW approach over HgCdTe detectors for this application - ruggedness and cost. Because the constitutive material is GaAs, the structure should be very robust with respect to variations in bias voltage, local oscillator power, temperature cycling, and other operating conditions. In preliminary devices, no change in the operating characteristics has been observed after repeated heterodyne tests and temperature cycles. In addition, devices can easily be fabricated on 2- or even 3-inch-diameter GaAs substrates, and either MBE or organometallic vapor phase epitaxy can be used to grow the MQW structures. Both of these epitaxial growth techniques have been widely adopted by industry, so that GaAs/AlGaAs MQW heterodyne technology could be easily applied for large-scale production. Furthermore, the planar processing used to fabricate the devices is well within the capabilities of most microelectronic fabrication facilities. As a result, thousands of good device chips can be obtained with high yield from one processed wafer, and the cost per device will be much less than for HgCdTe heterodyne discrete photodiodes.

Figure 5:
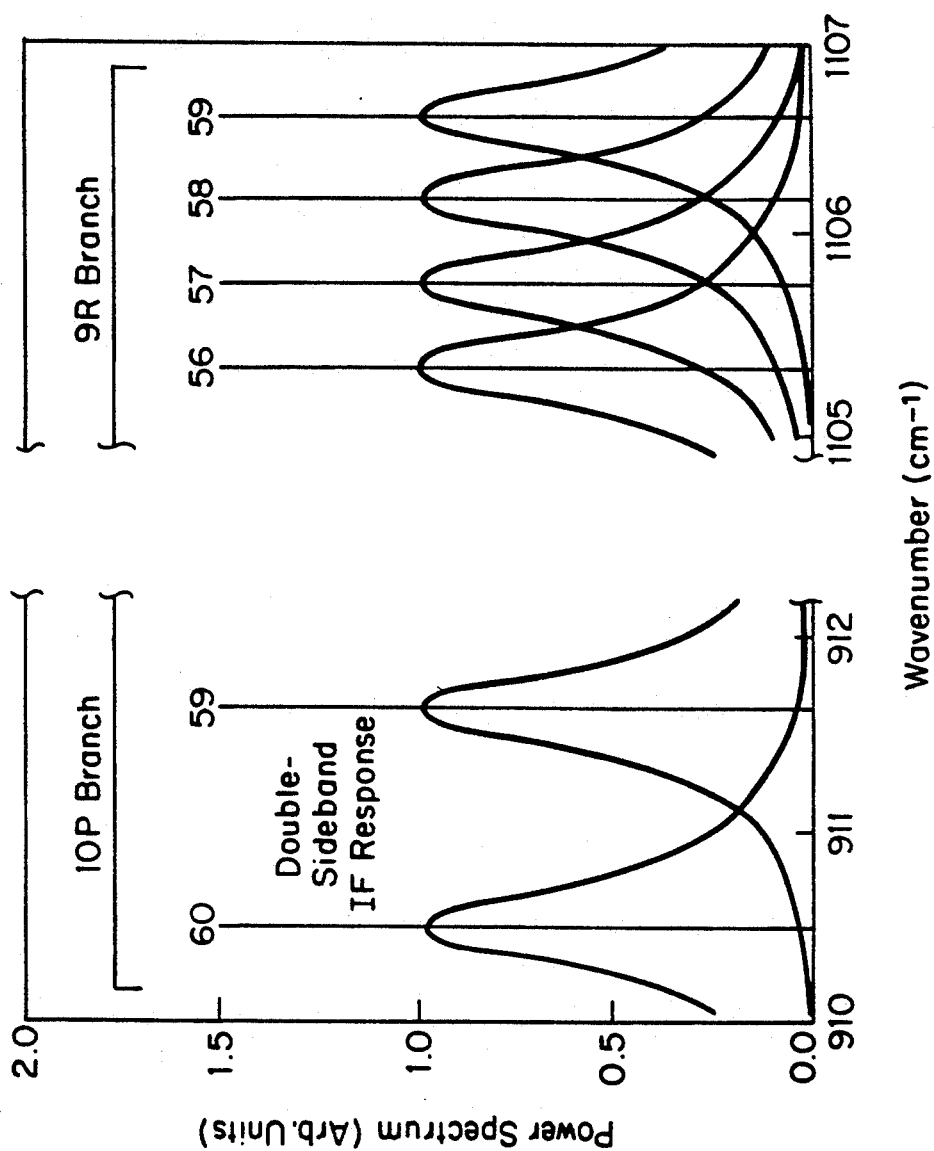
FIG. 5 is a plot of the receiver response spectrum versus wavenumber in $cm^{-1}$ for an isotopic $CO_2$ laser LO and an MQW heterodyne mixer having a $B_{IF}$ of 15 GHz.

The high IF bandwidth of the MQW device makes possible several applications in IR spectroscopy, communications, and radar systems that are beyond the capability of HgCdTe detectors. One possibility is continuous-frequency remote spectroscopy of atmospheric molecules involved in ozone depletion and global warming, such as HCl and $CH_4$, respectively. Our invention entails utilizing the wide IF bandwidth of the MQW device to fill in the frequency space between adjacent lines of a molecular gas laser. For example, the entire wavelength range, from approximately 9 to 11 $\mu m$ can be analyzed with extreme sensitivity by tuning sequentially through the lines of a single $CO_2$ isotope, such as $^{16}O^{12}C^{18}O$. This concept is represented schematically in FIG. 5, which shows the $CO_2$ lines at the short- and long-wavelength extremes of the laser emission band between 910 $cm^{-1}$ (10.99 $\mu m$) and 1107 $cm^{-1}$ (9.03 $\mu m$). The separation between adjacent $CO_2$ emission lines is approximately 1 $cm^{-1}$ (30 GHz) or less. Each $CO_2$ emission line is superimposed on the double-sideband IF response of the MQW detector, assuming that the IF bandwidth is 15 GHz. In practice, the $CO_2$ lines will be selected by adjusting a grating in the laser cavity. The cumulative sum of all of the IF response curves comprises the total IR spectroscopic response. Because of the overlap between adjacent IF response curves, molecular lines anywhere in the spectral region between 910 and 1107 $cm^{-1}$ can be detected with great sensitivity.

A new type of coherent receiver has been described to detect atmospheric molecular emission and absorption lines in the infrared (IR) region. The receiver is based on the multiple-quantum-well (MQW) optical mixer. The wide electrical bandwidth of this device is used to fill in the frequency gaps between adjacent laser lines of a molecular gas laser. For example, it will be possible to observe the entire spectral band between approximately 9 and 11 $\mu m$ with one such detector and one $CO_2$ laser that is tuned over its comb of emission lines. The same concept would apply to a different MQW device and a gas laser operating in the 3 to 5 $\mu m$ band. For example, other III-V materials could be used in place of the GaAs/AlGaAs mixer materials. InGaAs/InAlAs MQW optical mixers provide excellent response over the entire 3 to 5 $\mu m$ band. One possible gas laser for this band is He:Xe. In either case, the receiver will detect with photon-noise limited sensitivity, which corresponds to roughly 6 orders of greater sensitivity per Hz of electrical bandwidth than can be obtained with direct detection. Thus, the coherent detector will provide extremely sensitive remote detection of a wide array of gaseous molecules, such as $O_3$, HCl, and $CCl_2F_2$ (Freon-12). In addition most of the aromatic (i.e. benzene-ring-based compounds) can be detected. The aromatic compounds are abundant in crude oil and many of its derivatives. The detection process will entail the resolution of the vibrational or vibrational-rotational transitions of these molecules either in absorption or emission. Many of the detectable molecules play an important role in topics of environmental science, including ozone depletion, global warming, acid rain, fuel evaporation, and toxic-gas emission. Because these phenomena occur in both commercial and military arenas, the proposed detection system offers a dual-use benefit that will broaden its application and long-term utility.

Equivalents

Those skilled in the art will recognize, or be able to ascertain using no more than routine experimentation, many equivalents to specific embodiments of the invention described specifically herein. Such equivalents are intended to be encompassed in the scope of the following claims.

We claim:

1. A receiver for detecting infrared emission or absorption signals comprising:
   a) a local oscillator for generating a plurality of coherent local oscillator emissions at separate frequencies;

b) a combiner for combining the infrared signals with the local oscillator emissions to produce a combined optical beam; and c) an optical mixer having a bandwidth as wide as the separation between said local oscillator emissions for mixing the infrared signals with the local oscillator emissions in the combined beam to produce intermediate electrical frequency signals.

2. The receiver of claim 1 wherein the local oscillator comprises a coherent tunable laser and the mixer is a quantum well device formed of alternate layers of III-V material.

3. The receiver of claim 1 including a heterostructure field effect transistor amplifier for amplifying said intermediate frequency signals.

4. The receiver of claim 3 wherein the mixer and amplifier are formed integrally on the same substrate.

5. The receiver of claim 1 in which the infrared signals cover the spectrum of 3 microns to 5 microns or 9 microns to 11 microns, and the local oscillator emissions extend across a bandwidth of about 910 cm$^{-1}$ to 1107 cm$^{-1}$, and the separation between emissions is less than about 30 GHz.

6. The receiver of claim 1 in which the local oscillator is a laser and the mixer is a multiple quantum well device.

7. A receiver for detecting infrared emission or absorption signals comprising:

a) a local oscillator for generating a coherent optical signal at a plurality of known frequency lines; and b) an optical mixer having a bandwidth comparable to the separation between the frequency lines of the local oscillator for mixing the infrared signals with the optical signal to produce electrical intermediate frequency signals.

8. The receiver of claim 7 wherein the local oscillator comprises a coherent tunable laser and the mixer is a quantum well device formed of alternate layers of III-V material.

9. The receiver of claim 7 including a heterostructure field effect transistor amplifier for amplifying said intermediate frequency signals.

10. The receiver of claim 9 wherein the mixer and amplifier are formed integrally on the same substrate.

11. A method for detecting infrared emission or absorption signals across a broad bandwidth comprising the steps of:

a) generating a plurality of coherent local oscillator emissions at separate frequencies;

b) combining the infrared signals and local oscillator emissions into a single beam; and c) mixing the infrared signals with the local oscillator emissions by directing the beam onto a quantum well device having a bandwidth as wide as the separation between local oscillator emissions to produce an electrical intermediate frequency signals.

12. The method of claim 11 wherein the local oscillator emissions are provided by a coherent tunable laser and the mixing is provided by a quantum well device formed of alternate layers of III-V materials.

13. The method of claim 11 including amplifying said electrical signals.

14. The method of claim 11 in which the infrared signals cover the spectrum of 3 microns to 5 microns or 9 microns to 11 microns, and the local oscillator emissions extend across a bandwidth of about 910 cm$^{-1}$ to 1107 cm$^{-1}$ and the separation between emissions is less than about 30 GHz.

15. The method of claim 11 in which the local oscillator is a laser and the mixing is provided by a GaAs/GaAlAs multiple quantum well mesa device.

16. A method for detecting infrared emission or absorption signals comprising the steps of:

a) generating a coherent optical signal at a plurality of known frequency lines;

b) mixing the infrared signals with the optical signal in a quantum well device to produce electrical intermediate frequency signals wherein the separation between the frequency lines is comparable to the bandwidth of the device; and c) amplifying the intermediate frequency signals.

17. The method of claim 16 wherein the optical signal is generated by a coherent tunable laser and signals are mixed by a quantum well device formed of alternate layers of GaAs and AlGaAs.

18. The method of claim 17 including amplifying said intermediate frequency signals.

19. The method of claim 18 wherein the mixing and amplification are performed on the same substrate.

* * * * *